(12) United States Patent
Tam

(10) Patent No.: US 7,002,536 B2
(45) Date of Patent: Feb. 21, 2006

(54) DISPLAY DEVICE AND ELECTRONIC APPARATUS INCLUDING THE SAME

(75) Inventor: Simon Tam, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 543 days.

(21) Appl. No.: 09/962,586

(22) Filed: Sep. 26, 2001

(65) Prior Publication Data

US 2002/0047817 A1 Apr. 25, 2002

(30) Foreign Application Priority Data

Sep. 28, 2000 (GB) ............................................. 0023789

(51) Int. Cl.
*G09G 3/30* (2006.01)

(52) U.S. Cl. ............................. 345/76; 345/98; 345/205

(58) Field of Classification Search .................. 345/76, 345/80, 98, 44, 46, 82, 204, 205; 326/83, 326/86, 76; 315/169.1

See application file for complete search history.

(56) References Cited

U.S. PATENT DOCUMENTS

| | | | |
|---|---|---|---|
| 4,528,480 A | | 7/1985 | Unagami et al. |
| 5,734,297 A | * | 3/1998 | Huijsing et al. ............. 330/253 |
| 5,903,246 A | | 5/1999 | Dingwall |
| 6,054,874 A | * | 4/2000 | Sculley et al. ................. 326/83 |
| 6,081,131 A | * | 6/2000 | Ishii .............................. 326/68 |
| 6,566,970 B1 | * | 5/2003 | Ingino, Jr. .................... 331/57 |
| 6,617,878 B1 | * | 9/2003 | Brownlow et al. ........... 326/68 |
| 6,670,944 B1 | * | 12/2003 | Ishii ............................ 345/100 |
| 6,731,273 B1 | * | 5/2004 | Koyama et al. ............. 345/204 |
| 6,897,726 B1 | * | 5/2005 | Tsuchi ......................... 330/253 |
| 2005/0012538 A1 | * | 1/2005 | Geysen ........................ 327/403 |

FOREIGN PATENT DOCUMENTS

WO    WO 99/65012 A2    12/1999

* cited by examiner

*Primary Examiner*—Amare Mengistu
(74) *Attorney, Agent, or Firm*—Oliff & Berridge, PLC

(57) ABSTRACT

A display device comprising a plurality of pixels, each pixel containing a light emitting element and a plurality of substantially rectangular shaped circuit areas, the circuit areas comprising two current mirror circuit areas and two input pair circuit areas; the two current mirror circuit areas abutting each other so as to have a side of their rectangular areas in common, the two input pair circuit areas abutting each other so as to have a side of their rectangular areas in common, with both of the input pair circuit areas abutting a respective one of the current mirror circuit areas so as each to have a side of their rectangular areas in common. This arrangement of circuit areas overcomes the problem of spatial variation of TFT characteristics while avoiding the use of compensating circuits. Additionally, this arrangement of circuit areas can reduce to a minimum the p-type and n-type doping area required within each pixel.

12 Claims, 3 Drawing Sheets

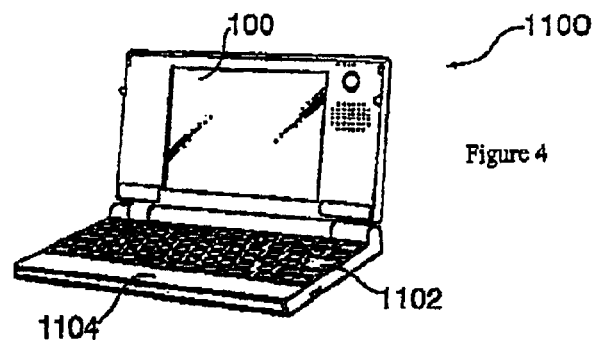
Figure 4
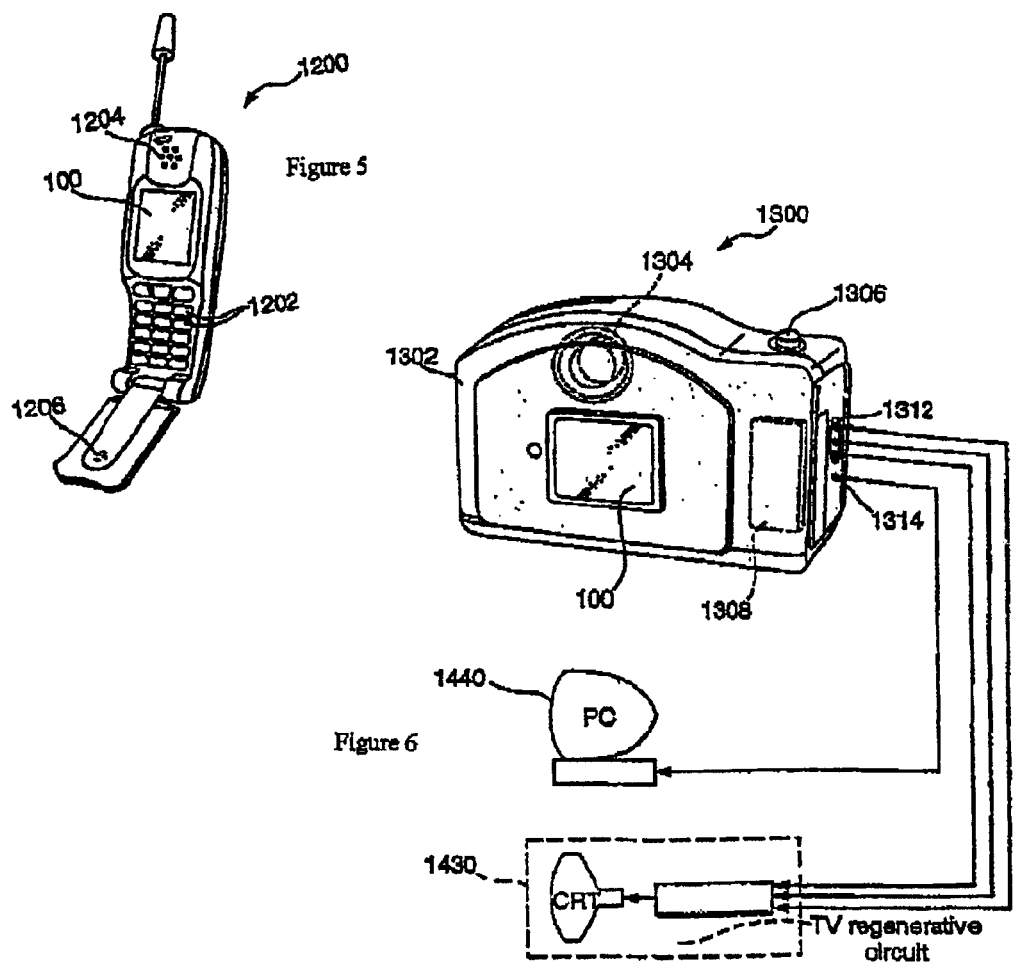
Figure 5
Figure 6

DISPLAY DEVICE AND ELECTRONIC APPARATUS INCLUDING THE SAME

The present invention relates to a display device, particularly a display device comprising a plurality of pixels with each pixel containing a light emitting element and a plurality of circuit components. The invention also relates to electronic apparatus including such a display device.

Known display devices exhibit certain disadvantages. For example, there is a desire to fabricate a display device of the aforementioned type using a large number of thin film transistors (herein referred to as TFTs) on a single substrate. However, devices comprising a large number of TFTs on a single substrate suffer from the problem of relatively large spatial variation of the transistor characteristics. The problem can be sufficiently severe to result in some analog circuits simply failing to operate to their designed standard. Although it might be possible, in at least some devices, to overcome this problem by introducing compensation circuits; such a solution increases the component count, increases the required substrate area an increases operating power consumption. Further, for example, there is currently no known design of such compensation circuits available for use with CMOS transistors.

It is an object of the present invention to provide an improved display device. It is an object of one particular embodiment of the present invention to provide a display device which cam be implemented using TFTs, which avoids the use of compensation circuits and which reliably performs to it's design standard.

According to the preset invention there is provided a display device comprising a plurality of pixels, each pixel containing a light emitting element and a plurality of substantially rectangular shaped circuit areas, the circuit areas comprising two current mirror circuit areas and two input pair circuit areas; the two current mirror circuit areas abutting each other so as to have a side of their rectangular areas in common, the two input pair circuit areas abutting each other so as to have a side of their rectangular areas in common, with both of the input pair circuit areas abutting a respective one of the current mirror circuit areas so as each to have a side of their rectangular areas in common.

The above described arrangement of circuit areas has been shown to be advantageous. For example, it can overcome the spatial variation of characteristics problem while avoiding the use of compensating circuits. Additionally, for TFT implementations the described arrangement of circuit areas can reduce to a minimum the p-type and n-type doping area required within each pixel.

Embodiments of the present invention will now be described in more detail, by way of further example only and with reference to the accompanying drawings in which:

FIG. 1 is a circuit diagram of pixel level circuitry to which the present invention can be applied;

FIG. 2 contains a circuit and waveform diagram for the comparator included in the circuitry shown in FIG. 1;

FIG. 4 is a schematic view of a mobile personal computer incorporating a display device according to the present invention;

FIG. 5 is a schematic view of a mobile telephone incorporating a display device according to the present invention; and FIG. 6 is a schematic view of a digital camera incorporating a display device according to the present invention.

Figure 1:
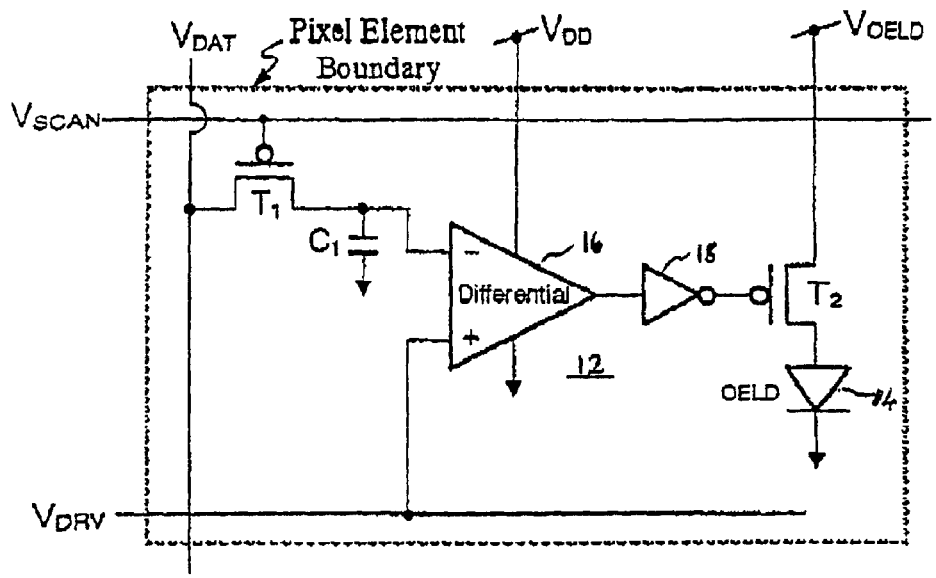

British patent application 0023787.5 describes an organic electroluminescent active matrix display device comprising a driver circuit which modulates the duty cycle of the on-state of a pixel during a frame period so as to provide gray scaling. The display provides pulse with modulation of the on-period of a pixel and the integrating function of the human eye perceives this as modulation of the intensity of the emitted light. Modulation of the on-period is in stark contrast to the conventional control of brightness to provide gray scaling in such devices, ie control of the instantaneous amplitude of the current supplied. FIG. 1 is a circuit diagram of the pixel level circuitry disclosed in British patent application 0023787.5.

FIG. 1 is a circuit diagram of an individual pixel 10 within an active matrix OELD display panel. The circuit is implemented using polysilicon TFT components and comprises an MOS-input comparator 12 and two pass-gates, $T_1$ and $T_2$. Comparator 12 comprises a long tail differential pair 16 and an inverter 18. The use of pass-gates avoids so-called "feed-through", i.e. coupling with other circuit voltages. The inverting input (+) of the comparator 12 is connected to a waveform source $V_{DRV}$. The non-inverting input (−) is connected to a storage capacitor $C_1$ and a pass-gate $T_1$. The pass-gate $T_1$ is controlled by a waveform $V_{SCAN}$. The output of the comparator is connected to a pass-gate $T_2$. Pass-gate $T_2$ controls the current flowing in to the organic light emitting element 14. By applying a time varying signal to $V_{DRV}$, the light emitting element 14 is switched on for a period depending on the value of the data voltage $V_{DAT}$ which is applied to the other side of pass-gate $T_1$ compared to the capacitor $C_1$ and the comparator 12.

In a line-at-a-time driving scheme, $V_{SCAN}$ sets the state of the pass-gate $T_1$ of the pixel elements on the same row. When pass-gate $T_1$ is closed, the data voltage $V_{DAT}$ is transferred to the inverting input of the comparator 12 and to the capacitor $C_1$. Then, when pass-gate $T_1$ is opened the data voltage is memorised by capacitor $C_1$. The waveform $V_{DRV}$ is then initiated. When the voltage, $V_+$, at the inverting input of the comparator 12 is less than the voltage, V−, at the non-inverting input thereof, the comparator outputs a LO signal which puts the light emitting element 14 in to the on-state. When the voltage, $V_+$, at the inverting input of the comparator 12 is greater than the voltage, V−, at the non-inverting input thereof, the comparator outputs a HI signal which puts the light emitting element 14 in to the off-state. As a result the data voltage stored by the capacitor $C_1$ modulates the duration for which the light emitting element 14 remains in the on-state during a frame period.

The frame period might typically be 20 mS and with the response time of the light emitting element 14 being of the order of nano-seconds, the speed of the polysilicon TFTs and any stray capacitance become the limiting factors in operation of the driving scheme. That is, exceptionally effective switching can be obtained.

In the circuit illustrated in FIG. 1, a common operating voltage $V_{OELD}$ is used for an OELD pixels of the same type. The voltage $V_{OELD}$ is set externally and is independent of the supply voltage $V_{DD}$ of the driving circuit. This significantly increases the flexibility of controlling the bias conditions for the OELDs.

A description will now be given of the detailed considerations which apply to the practical implementation of the comparator 12 used in the circuit of FIG. 1.

Since a separate comparator is provided for each pixel, the circuit area and power consumption of the comparator should be kept as low as possible. Further, in order to achieve a high number of gray scales, the comparator must be able to distinguish a small difference in input voltages. For example, if it is desired to implement 256 gray scales with a voltage swing of 0V to 5V then clearly something of the order of $\Delta V$=19.5 mV is appropriate. Thus switching must be very fast but, from the previous discussion, it is well within the ability of the described circuit.

Figure 2:
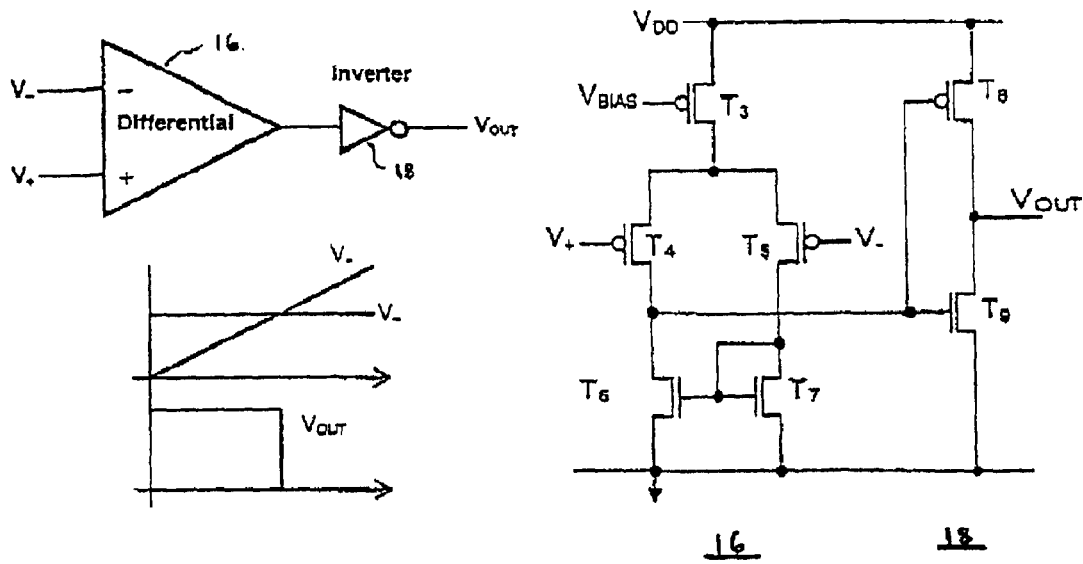

A detailed circuit diagram of one implementation of the comparator 12 of FIG. 1 is illustrated in FIG. 2. The circuit of FIG. 2 comprises two stages; a CMOS differential amplifier 16, and a CMOS inverter 18. The CMOS inverter 18 turns the pass-gate $T_2$ fully on or fully off very quickly. For level shifting purposes the power supply of the inverter stage 18 can be different from that of the differential stage 16.

The differential stage 16 comprises the drain-source series connection circuit of transistors $T_3$, $T_4$ and $T_6$ connected between the $V_{DD}$ rail and ground, together with the similarly connected circuit of transistor $T_3$, $T_5$ and $T_7$, wherein transistors $T_5$ and $T_7$ are connected in parallel with transistors $T_4$ and $T_6$. The respective gates of transistor $T_4$ and $T_5$ provide the two input terminals (+), (−) of the comparator 12, whereas the gate of transistor $T_3$ receives a bias voltage $V_{BIAS}$. The output stage 18 comprises two transistors, $T_8$ and $T_9$, which are source-drain series connected between the $V_{DD}$ rail and ground. The output $V_{OUT}$ of the comparator is taken from the connection between the transistors $T_8$ and $T_9$ and the gates thereof receive there input from the junction between transistors $T_4$ and $T_6$. The circuit illustrated in FIG. 2 uses seven TFTS. Using a respective TFT for $T_1$ and $T_2$ brings total per pixel to nine. As illustrated; TFTs $T_1$, $T_2$, $T_3$, $T_4$, $T_5$ and $T_8$ are p-type and TFTs $T_6$, $T_7$ and $T_9$ are n-type. All of the TFTs, as well as the storage capacitor, the OELD and all of the connection leads must be accommodated in the area of one pixel. Typically the pixel area might be 70.5 $\mu m^2$ and the OELD (denoted by "LEP" in FIG. 3) might be assigned a circular area of 30 $\mu m^2$ diameter.

Figure 3:
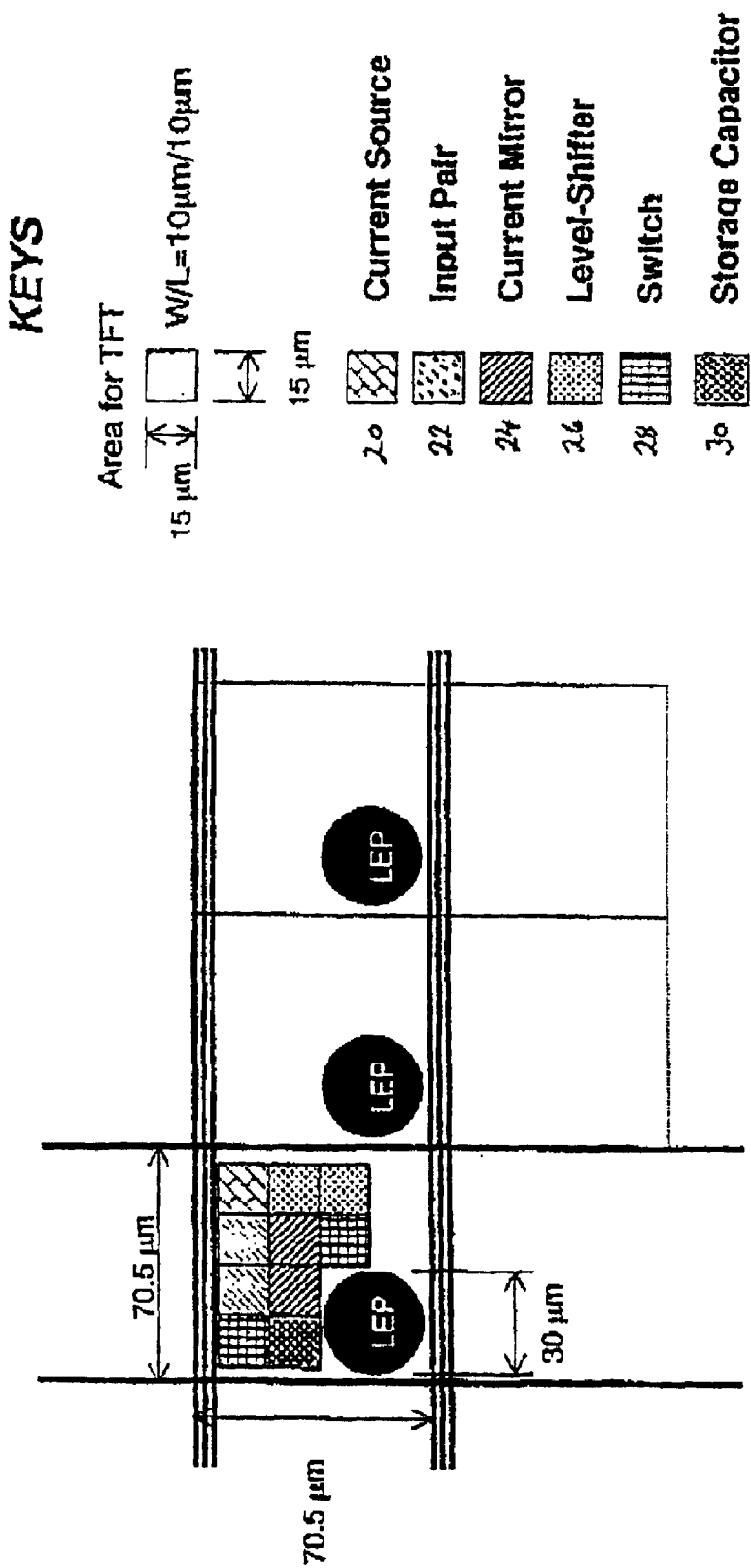
FIG. 3 illustrates the detailed arrangement of the circuit components within each pixel according to an embodiment of the present invention.

As illustrated in FIG. 3, the circuit components are assigned to rectangular areas of 15 $\mu m$ by 15 $\mu m$. This compares with an achievable TFT size (W/L) of 10 $\mu m$/10 $\mu m$. Generally, it is preferred that the area of each circuit area is substantially equal to one quarter of the area of the lighter emitting element. The layout of the ten rectangular circuit areas is illustrated in FIG. 3. They comprise: one current source area 20, two input pair areas 22, two current mirror areas 24, two level shifter areas 26, two switch areas 28 and a storage capacitor area 30.

According to the present invention a determination can be made of the device components which are most critically sensitive to variation of transistor characteristic. It has been determined that the most critically sensitive components are the input pair (22) and the current mirror pair (24). The input pair consists of transistors $T_4$ and $T_5$ and the current mirror pair consists of transistors $T_6$ and $T_7$. The present invention resides, in part, in arranging the two current mirror circuit areas 24 to abut each other so as to have a side of their rectangular areas in common, in arranging the two input pair circuit areas 22 to abut each other so as to have a side of their rectangular areas in common, and in arranging for both input pair circuit areas to abut a respective one of the current mirror circuit areas each to have a side of their rectangular areas in common. That is, the four circuit areas form a square one half of which is occupied by the two input pair transistors and the other half of which is occupied by the two current mirror transistors.

Preferably, the two current mirror circuit areas abut each other so as to have a side of their rectangular areas in common, the two input pair circuit areas abut each other so as to have a side of their rectangular areas in common, the two level shifter circuit areas abut each other so as to have a side of their rectangular areas in common, both input pair circuit areas abutting a respective one of the current mirror circuit areas, and one current mirror circuit area abutting a level shifter circuit area so as to have a side of their rectangular areas in common. Preferably, the current source circuit area abuts one of the input pair circuit areas so as to have a side of their rectangular areas in common. Preferably, the current source circuit area abuts one of the level shifter circuit areas so as to have a side of their rectangular areas in common. Preferably, the capacitor circuit area abuts one of the current mirror circuit areas so as to have a side of their rectangular areas in common. Preferably, one switch circuit area abuts one of the input pair circuit areas so as to have a side of their rectangular areas in common. Preferably, the said one switch circuit area abuts the capacitor circuit area so as to have a side of their rectangular areas in common. Preferably, the second switch circuit area abuts one of the current mirror circuit areas so as to have a side of their rectangular areas in common. Preferably, the second switch circuit area abuts one of the level shifter circuit areas so as to have a side of their rectangular areas in common. These preferences, which are illustrated in FIG. 3, result in the p-type and n-type doping area within the pixel being kept to a minimum.

Adjacent pixels might be arranged to have light emitting elements having different wavelength outputs. Thus, the three, elements denoted LEP in FIG. 3 might for example have respective outputs in the red, green, and blue regions of the spectrum. A colour display can thus be achieved.

Although reference has been made above to an active matrix OELD display panel, the present invention is not limited to such display panels. The present invention can be applied in any display device comprising a plurality of pixels in which the circuit areas according to the invention can be arranged. Similarly, although there are special benefits to be derived when the present invention is applied to a display device fabricated using TFT technology, the present invention is not limited to display devices implemented using TFT technology. The invention is applicable not only to thin film transistor technology but also to silicon based transistors. Silicon based transistors can be arranged on a display substrate using several different methods. For example, silicon based transistors can be arranged in a liquid.

The present invention is advantageous for use in small, mobile electronic products such as mobile phones, computers, CD players, DVD players and the like—although it is not limited thereto.

Several electronic apparatuses using the above described organic electroluminescent display device will now be described.

<1: Mobile Computer>

An example in which the display device according to one of the above embodiments is applied to a mobile personal computer will now be described, FIG. 4 is an isometric view illustrating the configuration of this personal computer. In the drawing, the personal computer 1100 is provided with a body 1104 including a keyboard 1102 and a display unit 1106. The display unit 1106 is implemented using a display panel fabricated according to the present invention, as described above.

<2: Portable Phone>

Next, an example in which the display device is applied to a display section of a portable phone will be described. FIG. 5 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using a display panel fabricated according to the present invention, as described above.

<3: Digital Still Camera>

Next, a digital still camera using an OEL display device as a finder will be described. FIG. 6 is an isometric view illustrating the configuration of the digital still camera and the connection to external devices in brief.

Typical cameras sensitize films based on optical images from objects, whereas the digital still camera 1300 generates imaging signals from the optical image of an object by photoelectric conversion using, for example, a charge coupled device (CCD). The digital still camera 1300 is provided with an OEL element 100 at the back face of a case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OEL element panel 100 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 4, the portable phone shown in FIG. 5, and the digital still camera shown in FIG. 6, include television sets, view-finder-type and monitoring-type video tape recorders, car navigation systems, pagers, electronic notebooks, portable calculators, word processors, workstations, TV telephones, point-of-sales system (POS) terminals, and devices provided with touch panels. Of course, the above described embodiments of the present invention can be applied to the display sections of these electronic apparatuses.

What is claimed is:

1. A display device, comprising:
a plurality of pixels, each pixel containing a light emitting element and a plurality of physical circuit areas which are substantially rectangular in shape, the circuit areas comprising a current source circuit area, two level shifter circuit areas, a switch circuit area, a capacitor circuit area, two current mirror circuit areas and two input pair circuit areas, wherein
the two current mirror circuit areas abut each other so as to have a side of rectangular areas in common;
the two input pair circuit areas abut each other so as to have a side of their physical rectangular areas in common, with both of the input pair circuit areas abutting a respective one of the current mirror circuit areas so as each to have a side of their rectangular areas in common;
the two level shifter circuit areas abut each other so as to have a side of their rectangular areas in common, and one current mirror circuit area abuts a level shifter circuit area so as to have a side of their rectangular areas in common;
the switch circuit area abuts one of the input pair circuit areas so as to have a side of their rectangular areas in common; and
the capacitor circuit area abuts one of the current mirror circuit areas so as to have a side of their rectangular areas in common.

2. A display device as claimed in claim 1, wherein the current source circuit area abuts one of the input pair circuit areas so as to have a side of their rectangular areas in common.

3. A display device as claimed in claim 1, wherein the current source circuit area abuts one of the level shifter circuit areas so as to have a side of their rectangular areas in common.

4. A display device as claimed in claim 1, wherein the switch circuit area abuts the capacitor area so as to have a side of their rectangular areas in common.

5. A display device as claimed in claim 1, wherein each of the plurality of circuit areas comprises a second switch circuit area.

6. A display device as claimed in claim 5, wherein the second switch circuit area abuts one of the current mirror circuit areas so as to have a side of their rectangular areas in common.

7. A display device as claimed in claim 5, wherein the second switch circuit area abuts one of the level shifter circuit areas so as to have a side of their rectangular areas in common.

8. A display device as claimed in claim 1, wherein each of the plurality of circuit areas is the same size.

9. A display device as claimed in claim 1, wherein each pixel is of substantially rectangular shape and each light emitting element is located in one corner of the respective pixel.

10. A display device as claimed in claim 1, wherein the area of each of the plurality of circuit areas is substantially equal to $1/\pi$ of the area of the light emitting element.

11. A display device as claimed in claim 1, wherein one or more of the plurality of circuit areas include thin film transistors.

12. A display device as claimed in claim 1, wherein the light emitting element is an organic electroluminescent light emitting element.

* * * * *